(12) United States Patent
Shah

(10) Patent No.: US 6,517,371 B1
(45) Date of Patent: *Feb. 11, 2003

(54) ANTI-CONTAMINANT COMPONENT SOCKET

(75) Inventor: Dwip Shah, Round Rock, TX (US)

(73) Assignee: Dell Products L.P., Round Rock, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/313,863

(22) Filed: May 18, 1999

(51) Int. Cl.[7] ............................................. H01R 13/625
(52) U.S. Cl. ...................................... 439/342; 439/145
(58) Field of Search ........................... 439/342, 70, 71, 439/137, 138, 139, 140, 135, 136, 142, 143, 144, 145

(56) References Cited

U.S. PATENT DOCUMENTS

| | | | | |
|---|---|---|---|---|
| 4,420,205 A | * | 12/1983 | Kirkman | ..................... 439/342 |
| 5,496,186 A | * | 3/1996 | Dobbelaere et al. | ......... 439/157 |
| 5,611,705 A | * | 3/1997 | Pfaff | ........................... 439/342 |
| 5,669,780 A | * | 9/1997 | Fukunaga | .................... 439/342 |
| 5,692,920 A | | 12/1997 | Banakis et al. | ............. 439/342 |
| 5,791,929 A | | 8/1998 | Banakis et al. | ............. 439/342 |
| 5,893,770 A | | 4/1999 | Gober | ......................... 439/342 |
| 5,982,459 A | * | 11/1999 | Fandrianto et al. | ...... 348/845.2 |

* cited by examiner

*Primary Examiner*—Tulsidas Patel
(74) *Attorney, Agent, or Firm*—Baker Botts L.L.P.

(57) ABSTRACT

A method and apparatus including a component socket, and an actuating device, operably coupled with the component socket, where the actuating device has at least one anti-contaminant mode. In one embodiment, the component socket can be a zero insertion force socket. In another embodiment, the actuating device, operably coupled with the component socket, where the actuating device has at least one anti-contaminant mode further includes the actuating device operably coupled with an anti-contaminant shield.

46 Claims, 8 Drawing Sheets

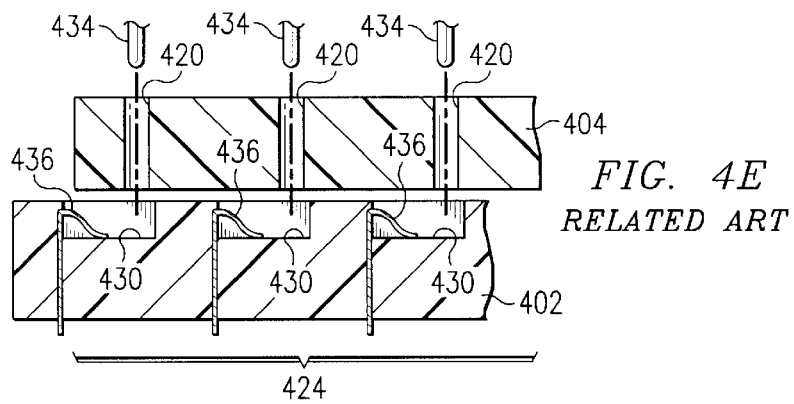
*FIG. 4E*
*RELATED ART*
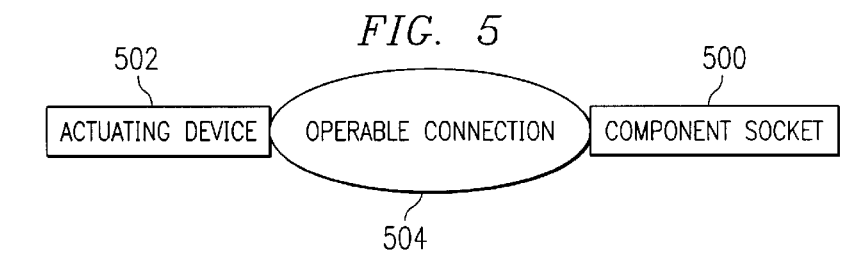
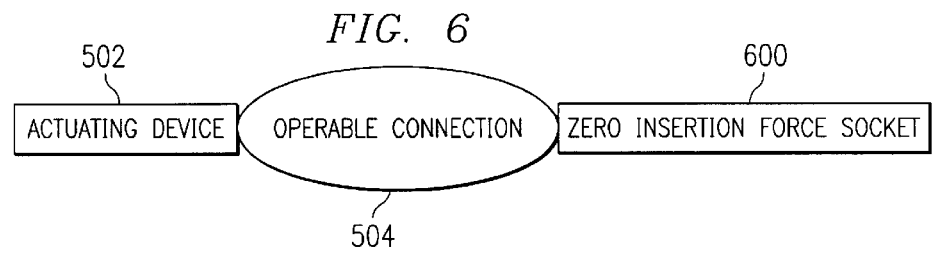
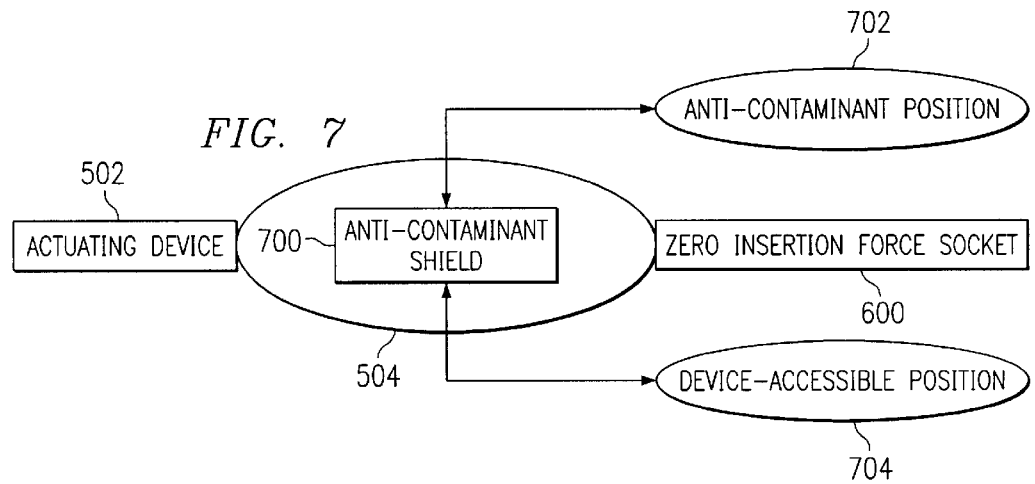

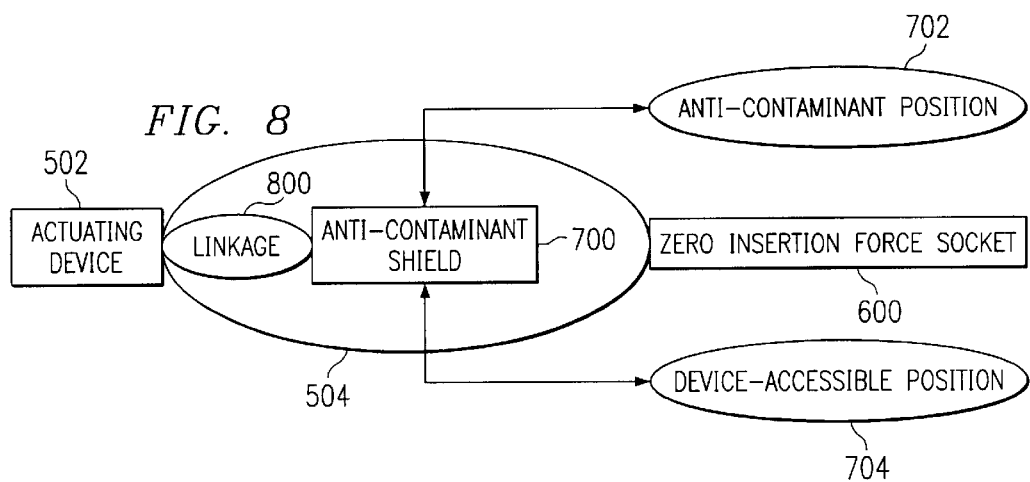
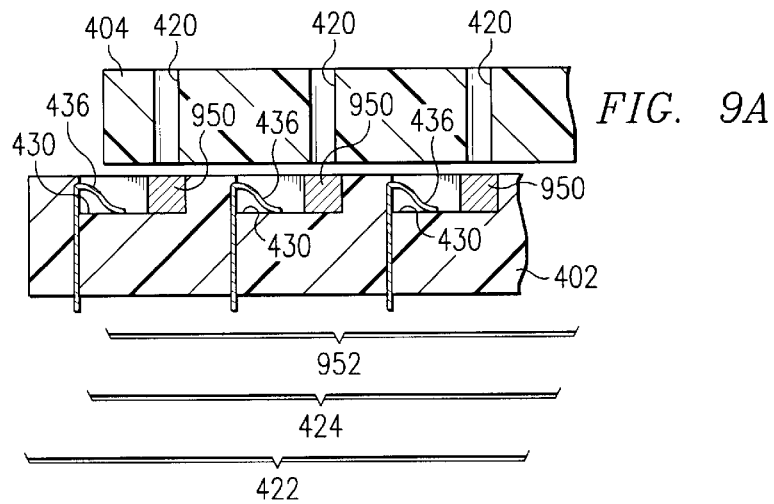
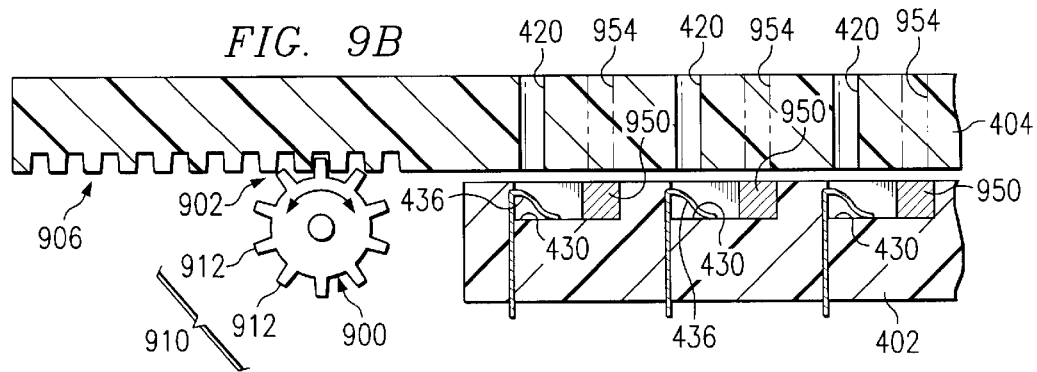

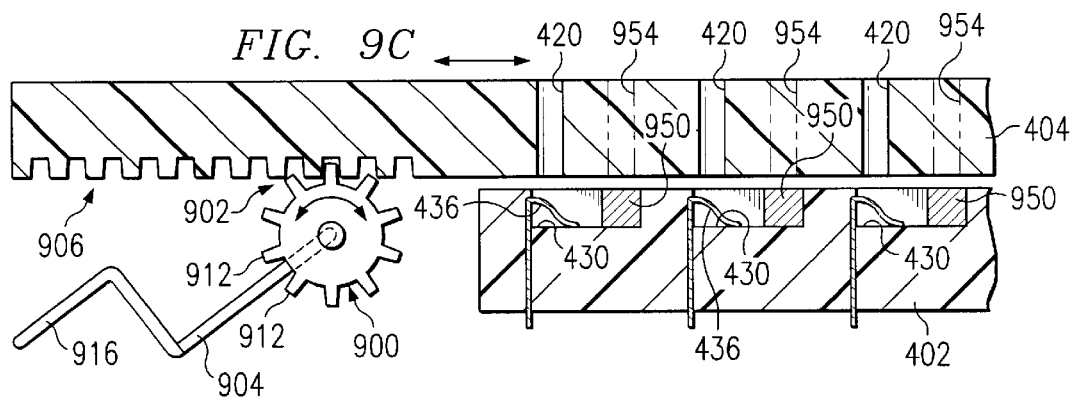
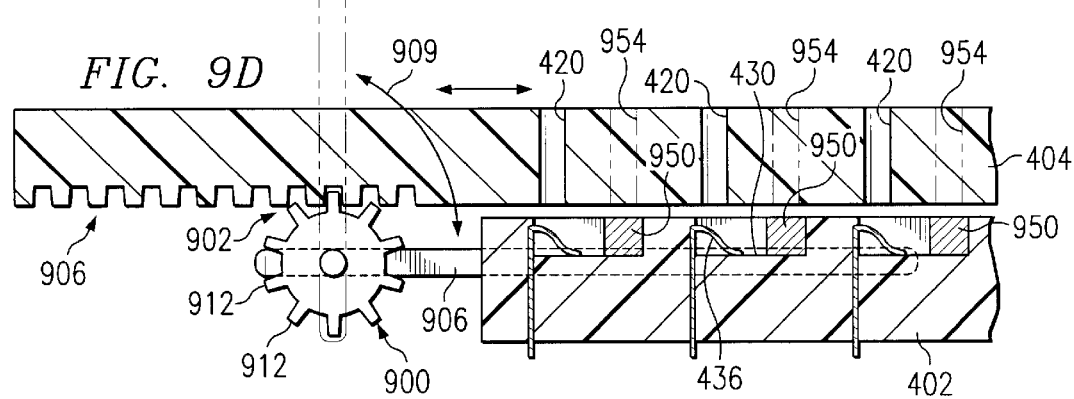
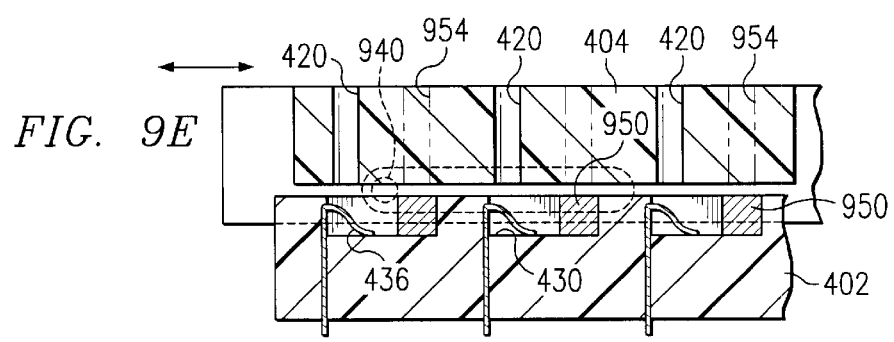

ANTI-CONTAMINANT COMPONENT SOCKET

BACKGROUND OF THE INVENTION

1. Field of the Invention

The present invention is directed, in general, toward data processing systems. In particular, the present invention is directed toward component sockets, such as, for example, Zero Insertion Force (ZIF) sockets, utilized in data processing systems.

2. Description of the Related Art

In the early days of personal computers ("PC"s), microprocessor central processing units ("CPU"s) and other major electronic components thereof were soldered directly to a circuit board. Although this was a cost-efficient mounting method as far as manufacturing was concerned, there were several major drawbacks. First, heat generated during the soldering process sometimes overheated the components, rendering them useless or limiting their lifetime. Although soldering techniques improved over the years, such overheating remained a concern. Second, if the component was found faulty during a later-performed test, the component had to be unsoldered from the circuit board and a new one resoldered in its place, again with the risk of heat overexposure during soldering. As the components grew more integrated and sophisticated, pin count increased, increasing heat delivered to the component during soldering and greatly complicating component replacement.

Because of the above-discussed deficiencies of direct solder-mounting of components, low insertion force ("LIF") sockets were developed. LIF sockets were designed to be directly soldered to the circuit board in lieu of a component. LIF sockets provided a plurality of apertures on an upper surface thereof for receiving the component pins. Each of the apertures contained a spring-loaded contact that frictionally gripped each pin as it was inserted. The combined frictional force of all of he spring-loaded contacts on the component pins retained the component in the socket and provided for good electrical contact between the component pins and those on the LIF socket.

As component size and pin count continued to grow, however, LIF sockets became problematical. Each spring-loaded contact in the LIF socket required a certain amount of spring force to maintain good electrical contact. However, as pin count grew, the total spring and frictional force also grew. At some point, the combined frictional force of all of the spring-loaded contacts made insertion or extraction of the component from the LIF socket difficult. Sometimes, the required insertion force bent or folded slightly misaligned component pins, placing the entire component at risk. If the insertion or extraction force was not applied uniformly, pins were at risk of being bent or broken. The design of many-apertured LIF sockets required keeping individual aperture friction to a minimum to keep total insertion or extraction force to a practical level. However, a sufficient amount of spring-loading in each aperture was needed to maintain reliable electrical contact. Often, a special-purpose component removal tool was required for extracting many-pinned components (particularly microprocessor CPUs) from LIF sockets.

Today's PCs are often designed to operate with improved components as they are developed. For example, as an improved microprocessor becomes available, a user wishing to increase PC performance need only replace the existing microprocessor with an upgraded model. Unfortunately, many users lack the dexterity, gentility, strength and confidence necessary to install many-pinned components in LIF sockets. Thus, the many users that would benefit from the increased performance of a component upgrade are deterred from undergoing the transition.

In response to the user's concern, PCs are beginning to be equipped with zero insertion force ("ZIF") sockets to eliminate a need for the user to apply substantial insertion or extraction forces to upgrade components. Like LIF sockets, ZIF sockets are designed to be directly soldered to the circuit board. ZIF sockets also provide a plurality of apertures on an upper surface thereof for receiving the component pins. Unlike LIF sockets, the apertures do not contain spring-loaded contacts, but accept each component pin without substantial frictional resistance. An arm is rotatably mounted to the ZIF socket. Rotation of the arm causes a relative translation of portions of the ZIF socket with respect to each other. The portions place the component pins in a mechanical shear or bind within the apertures. The mechanical bind brings about a good electrical contact for each of the component pins. The combined mechanical bind of all of the apertures presents a substantial retention force to hold the component in the ZIF socket. Unlike LIF sockets, ZIF sockets do not need to sacrifice individual aperture retention force and concomitant electrical contact integrity to keep total insertion or extraction forces to an acceptable level. Thus ZIF sockets therefore typically have high retention forces relative to LIF sockets.

As has been indicated above, there are typically two positions for the ZIF style connector mentioned above: "open," and "closed." Both positions are achieved by manipulation of the lever arm of ZIF style connectors.

The open position of the ZIF style connectors is to allow the pins of whatever data processing system component is inserted into the ZIF socket. The closed position of the ZIF style connectors is to secure the component within the ZIF style socket such that good electrical connection is achieved. Typically, to achieve the closed position, a lever arm is actuated to force the pins of the data processing system component (e.g., a microprocessor) to slide within the connector and causes the pins of the inserted component to wipe against the electrical contacts within the apertures of the ZIF style sockets.

ZIF style connectors are most often used in the manufacturing of data processing systems and/or components used in data processing systems. During manufacturing, it is common for contaminants to be present. One such contaminant is flux, which is a material commonly utilized to achieve efficient connection between the parts in the data processing systems. Depending on its condition (e.g., oxidized or non-oxidized) the a contaminant , such as flux, can function as either an electrical connector or an electrical insulator.

With respect to the ZIF style connectors, irrespective of whether the connectors are in their open or closed positions, their apertures containing electrical connections are open to the environment (meaning that contaminants, such as flux, can enter those apertures).

When such contaminants enter the ZIF connector apertures, they often coat the electrical contacts within the apertures. It has been found empirically that the wiping action and the normal force generated is typically not adequate to remove contaminants, such as flux, from the electrical contacts within the apertures. The practical result of the foregoing is that one or more electrical connections within the ZIF socket are disrupted.

During testing, such disrupted electrical connections often manifest themselves as symptoms such as NO POST, where such symptoms indicate either a poor electrical connection or a bad electrical component. The common response to such symptoms in the art is to manually remove and reinsert the component until a good connection is established between the data processing system component and electrical connector. In the event that a good electrical connection cannot be achieved, it is common to discard one or both the socket and connector.

Those skilled in the art will recognize that the foregoing described method takes time and often results in discardment of otherwise good components due to such contamination. It is therefore apparent that a need exists in the art for a method and apparatus which will decrease the likelihood of such foregoing-described contamination.

SUMMARY OF THE INVENTION

It has been discovered that a method and apparatus can be devised which, among other things, will decrease the likelihood that apertures, and thus the apertures corresponding electrical components, within a ZIF style connector will become contaminated.

In one embodiment, the method and apparatus include a component socket, and an actuating device, operably coupled with the component socket, where the actuating device has at least one anti-contaminant mode. In one embodiment, the component socket can be a zero insertion force socket. In another embodiment, the actuating device, operably coupled with the component socket, where the actuating device has at least one anti-contaminant mode further includes the actuating device operably coupled with an anti-contaminant shield.

In another embodiment, the method and apparatus include operably coupling a component socket with an actuating device, the actuating device having at least one anti-contaminant mode. Operably coupling a component socket with an actuating device, the actuating device having at least one anti-contaminant mode can further include operably coupling a zero insertion force socket with the actuating device having at least one anti-contaminant mode. Operably coupling a component socket with an actuating device, the actuating device having at least one anti-contaminant mode can yet further include operably coupling said actuating device to an anti-contaminant shield.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings. In the accompanying drawings, like parts are generally indicated by like numbers.

FIG. 4E shows an assembled cut-away plan view of a volume segment of a ZIF style connector.

FIG. 5 shows a partial high-level block diagram depicting an embodiment of the present invention.

FIG. 6 shows a partial high-level block diagram depicting an embodiment of the present invention.

FIG. 7 shows a partial high-level block diagram depicting an embodiment of the present invention.

FIG. 8 depicts a partial high-level block diagram depicting an embodiment of the present invention.

FIG. 9A depicts an embodiment of the present invention in the context of an assembled cut away view of volume segment of a ZIF style connector.

FIG. 9B illustrates an embodiment of the present invention which includes a gear assembly.

FIG. 9C shows an embodiment of the present invention similar to that illustrated in FIG. 9B which includes a lever arm having a crank handle.

FIG. 9D shows an embodiment of the present invention similar that illustrated in FIG. 9C, which includes a lever arm which can be used to move a sliding cover between anti-contamination, open, and closed positions.

FIG. 9E depicts an embodiment of the present invention whereby a fixed peg is located affixed to a base housing, and a sliding cover can move along the guide provided by the fixed peg.

DESCRIPTION OF THE PREFERRED EMBODIMENT(S)

The following sets forth a detailed description of the best contemplated mode for carrying out the multiple independent inventions described herein. The description is intended to be illustrative and should not be taken to be limiting. In addition, the following detailed description has been divided into sections (e.g., sections I–II) in order to highlight the invention described herein; however, those skilled in the art will appreciate that such sections are merely for illustrative focus, and that the invention herein disclosed typically draws its support from multiple sections. Consequently, it is to be understood that the division of the detailed description into separate sections is merely done as an aid to understanding and is in no way intended to be limiting.

I. DATA PROCESSING ENVIRONMENTS

Figure 1:
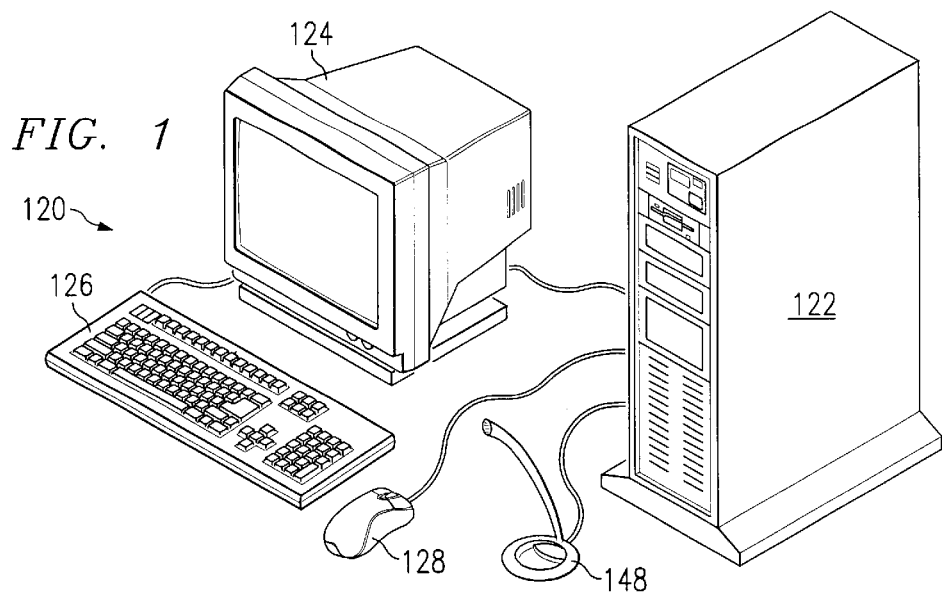
FIG. 1 depicts a pictorial representation of a data-processing system which can be utilized in accordance with the method and system of an illustrative embodiment of the present invention.

With reference now to the figures and in particular with reference now to FIG. 1, there is depicted a pictorial representation of a data-processing system which can be utilized in accordance with the method and apparatus of at least one illustrative embodiment of the present invention. A data processing system 120 is depicted which includes a system unit 122, a video display terminal 124, a keyboard 126, a mouse 128, and a microphone 148. Data processing system 120 may be implemented utilizing any suitable computer such as an IBM-compatible or an Apple-compatible personal computer.

Figure 2:
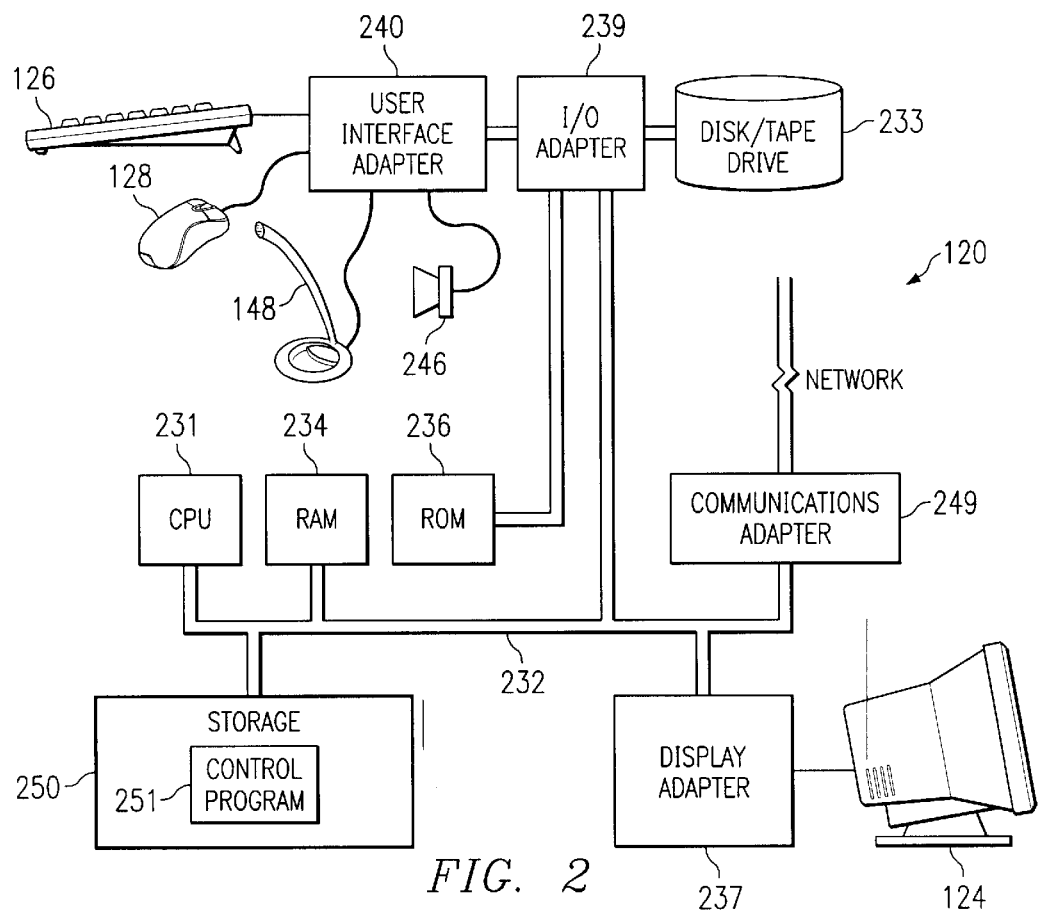
FIG. 2 illustrates a representative hardware environment, which can be utilized in accordance with the method and system of an illustrative embodiment of the present invention.

FIG. 2 is an illustration of a representative hardware environment, which incorporates a graphical user interface, which can be utilized in accordance with the method and apparatus of at least one illustrative embodiment of the present invention. FIG. 2 depicts selected components in data processing system 120 in which an illustrative embodiment of the present invention may be implemented. Data processing system 120 includes a Central Processing Unit ("CPU") 231, such as a conventional microprocessor, and a number of other units interconnected via system bus 232. Such components and units of computer 120 can be implemented in a system unit such as system unit 122 of FIG. 1. Computer 120 includes random-access memory ("RAM") 234, read-only memory ("ROM") 236, display adapter 237 for connecting system bus 232 to video display terminal 124, and I/O adapter 239 for connecting peripheral devices (e.g., disk and tape drives 233) to system bus 232. Video display terminal 124 is the visual output of computer 120, which can be a CRT-based video display well-known in the art of computer hardware. However, with a portable or notebook-based computer, video display terminal 124 can be replaced with an LCD-based or a gas plasma-based flat-panel display. Computer 120 further includes user interface adapter 240 for connecting keyboard 126, mouse 128, speaker 246, microphone 148, and/or other user interface devices, such as a touch screen device (not shown), to system bus 232 through I/O adapter 239. Communications adapter 249 connects computer 120 to a data-processing network.

Any suitable machine-readable media may retain the graphical user interface, such as RAM 234, ROM 236, a magnetic diskette, magnetic tape, or optical disk (the last three being located in disk and tape drives 233). Any suitable operating system and associated graphical user interface (e.g., Microsoft Windows) may direct CPU 231. Other technologies can also be utilized in conjunction with CPU 231, such as touch-screen technology or human voice control. In addition, computer 120 includes a control program 251 which resides within computer storage 250. Control program 251 contains instructions that when executed on CPU 231 carries out the operations depicted in any examples, state diagrams, and flowcharts described herein.

Those skilled in the art will appreciate that the hardware depicted in FIG. 2 may vary for specific applications. For example, other peripheral devices such as optical disk media, audio adapters, or programmable devices, such as PAL or EPROM programming devices well-known in the art of computer hardware, and the like may be utilized in addition to or in place of the hardware already depicted.

Those skilled in the art will recognize that data processing system 120 can be described in relation to data processing systems which perform essentially the same functionality, irrespective of architectures. As an example of such, an alternative partial architecture data processing system 120 is set forth in FIG. 3.

Figure 3:
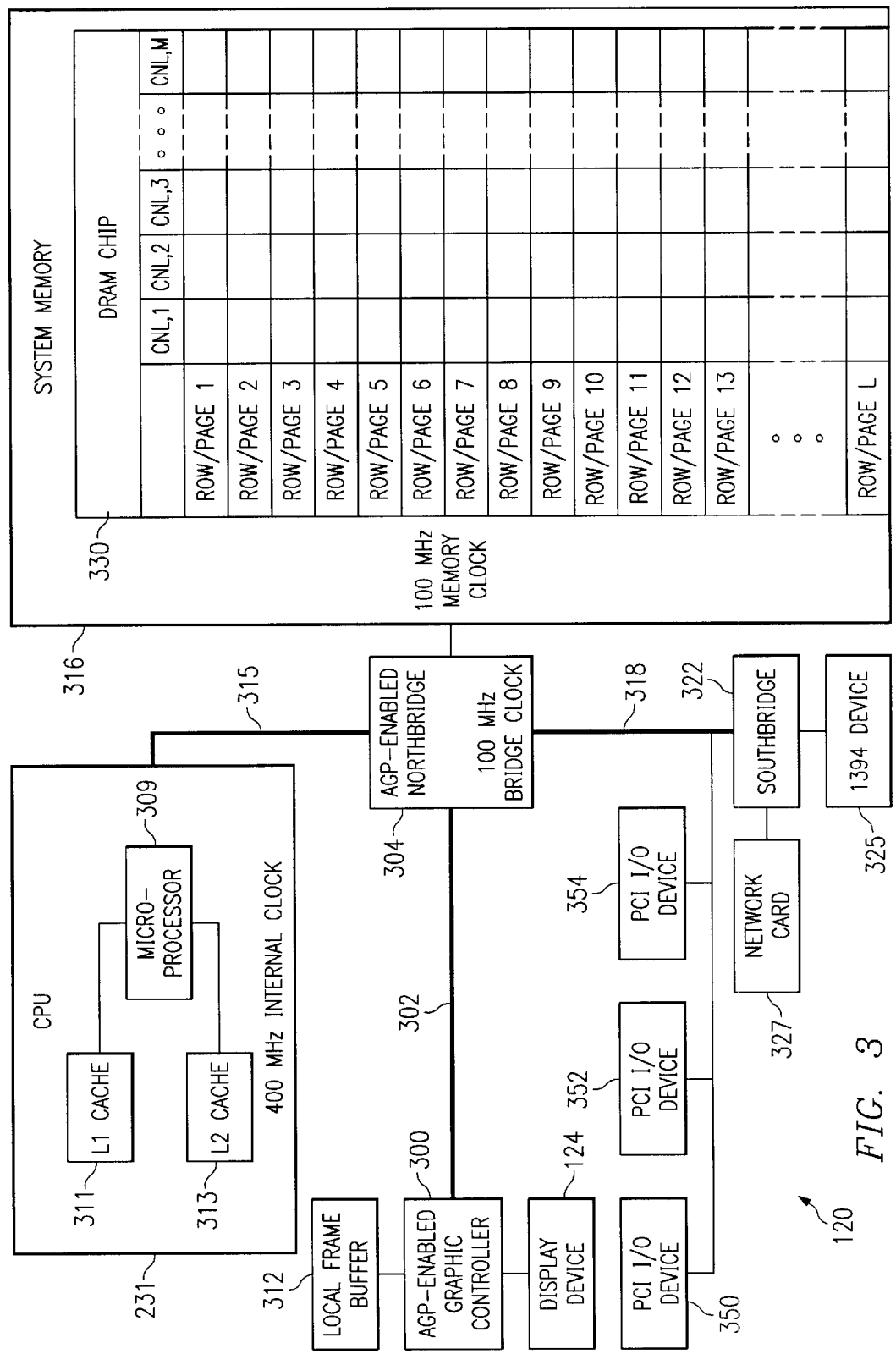
FIG. 3 shows a high-level component diagram depicting a data processing system which illustrates another environment wherein one or more embodiments of the present invention may be practiced.

Referring now to FIG. 3, shown is a high-level component diagram depicting a partial data processing system 120 which illustrates another environment wherein one or more embodiments of the present invention may be practiced. Shown are AGP-enabled graphics controller 300, AGP interconnect 302 (a data bus), and AGP-enabled Northbridge 304. Not shown, but deemed present is an AGP-enabled operating system. The term AGP-enabled is intended to mean that the so-referenced components are engineered such that they interface and function under the standards defined within the AGP interface specification (Intel Corporation, Accelerated Graphics Port Interface Specification). Further depicted are video display device 124, local frame buffer 312, Central Processing Unit (CPU) 231 (wherein are depicted microprocessor 309, L1 Cache 311, and L2 Cache 313), CPU bus 315, system memory 316 (wherein is illustrated DRAM chip 330), Peripheral Component Interconnect (PCI) bus 318, various PCI Input-Output (I/O) devices 350,352, and 354, Southbridge 322, 1394 Device 325, and network card 327.

The foregoing components and devices are used herein as examples for sake of conceptual clarity. As for (non-exclusive) examples, CPU 231 is utilized as an exemplar of any general processing unit, including but not limited to multiprocessor units; CPU bus 315 is utilized as an exemplar of any processing bus, including but not limited to multi-processor buses; PCI devices 350–354 attached to PCI bus 318 are utilized as an exemplar of any input-output devices attached to any I/O bus; AGP Interconnect 302 is utilized as an exemplar of any graphics bus; AGP-enabled graphics controller 300 is utilized as an exemplar of any graphics controller; Northbridge 304 and Southbridge 322 are utilized as exemplars of any type of bridge; 1394 device 325 is utilized as an exemplar of any type of isochronous source; and network card 327, even though the term "network" is used, is intended to serve as an exemplar of any type of synchronous or asynchronous input-output cards. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

Generally, each bus utilizes an independent set of protocols (or rules) to conduct data (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 304, Southbridge 322, and other bridges shown in that it is to be understood that such can translate and coordinate between various data buses and/or devices which communicate through the bridges.

II. ANTI-CONTAMINANT DEVICE AND PROCESS

Those skilled in the art will recognize that virtually all of the components discussed above in relation to data processing system 120 must in some fashion be affixed to a circuit board. Those skilled in the art will also recognize that one way in which such components may be affixed to their respective circuit boards is via ZIF style connectors (and their functional equivalents) discussed in the background section, above. Thus, various embodiments of the present invention should find general applicability in data processing systems, and should prove particularly useful to data processing system manufactures and vendors who incorporate the various embodiments into their manufactured and sold data processing systems. Furthermore, it is also expected that data processing system component manufacturers will also incorporate various of the embodiments into their manufactured and sold components.

Figure 4A:
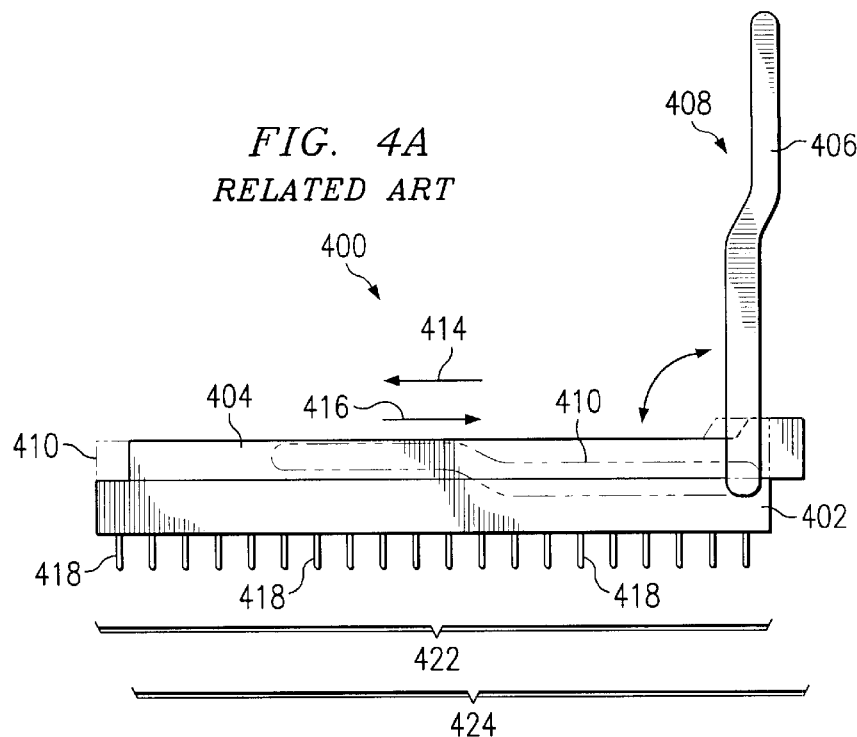
FIG. 4A depicts a plan view of a ZIF style socket.
Figure 4B:
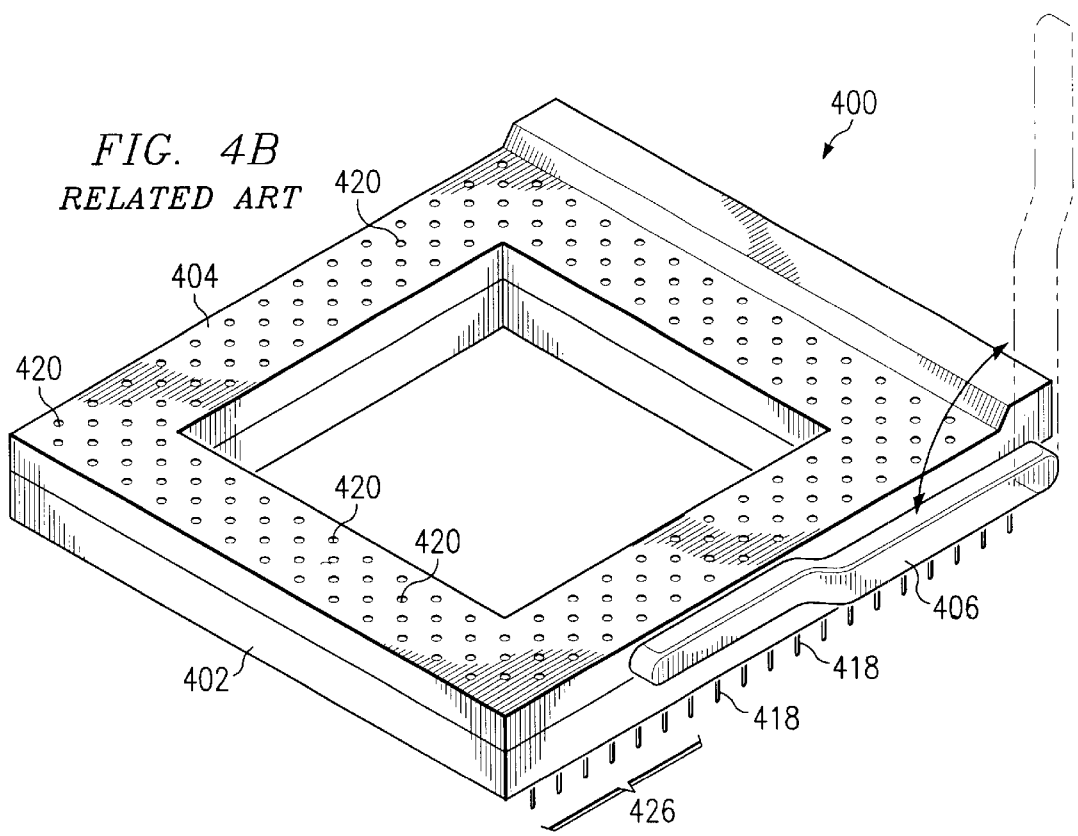
FIG. 4B depicts a perspective view of a ZIF style socket.

Referring now to FIGS. 4A and 4B, shown are a perspective view and a plan view of a related-art ZIF style connector. FIG. 4A depicts a plan view of ZIF style socket 400. Illustrated is that ZIF style socket 400 has a base housing 402, sliding cover 404 and lever arm 406. Shown is that lever arm 406 can be moved between two modes: open mode 408 and closed mode 410. As lever arm 406 is moved from open mode 408 to closed mode 410, sliding cover 404 moves in direction 414 relative to base housing 402 until sliding cover 404 comes to rest in closed position 422 (closed position 422 of sliding cover 404 is drawn with dashed lines in FIG. 4A). Conversely, as lever arm 406 is moved from closed mode 410 to open mode 408, sliding cover 404 is forced to move in direction 416 relative to base housing 402 until sliding cover 404 comes to rest in open position 424 (illustrated by the position of sliding cover 404 drawn with dashed lines in FIG. 4A). Those skilled in the art will recognize that in practice it is common to insert the pins from a component to be mounted on a circuit board into ZIF style socket 400 while sliding cover 404 is in the open position and that thereafter the movement in direction 414 of sliding cover 404 into closed position 422 is what causes the pins of any component so inserted to wipe against their respective appropriate electrical contacts (not shown) within base housing 402. Also shown are solder pins 418 on the bottom of base housing 402. Each solder pin 418 is electrically connected to that solder pin's 418 appropriate electrical contact (not shown) within base housing 402. As discussed in the background section, the use of solder pins 418 allow ZIF socket 400 to be soldered onto a printed circuit board. Thereafter, a component to be mounted on the board can instead be inserted in ZIF socket 400 thereby insulating such from excess heat that it would have suffered had it been directly soldered to the printed circuit board.

FIG. 4B depicts the perspective view of ZIF style socket 400. Illustrated is that ZIF style socket has apertures 420 to receive pins from components to be inserted into ZIF style socket 400. Those skilled in the art will recognize that many various ZIF socket aperture configurations are available within the art. Also shown is a volume segment 426 of ZIF style connector 400 which will be used below to illustrate how movement of sliding cover 404 achieves electrical connections of components pins with electrical connectors.

Figure 4C:
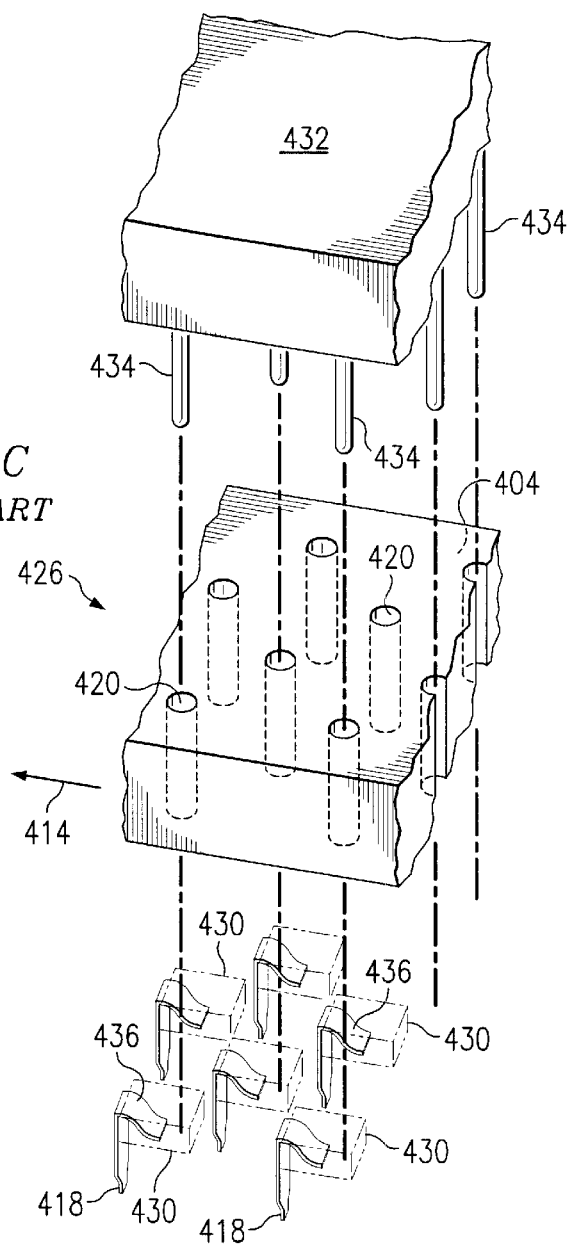
FIG. 4C illustrated is a partially disassembled cut-away view of a volume segment of a ZIF style socket.

Referring now to FIG. 4C, illustrated is a partially disassembled cut away view of volume segment 426. Shown are slots 430 typically resident within base housing 402 (not shown in FIG. 4C). Component 432 has pins 434 which are inserted through apertures 420. When sliding cover 404 is in open position 424 (not shown), the pins extend downward into slots 430 but do not contact electrical contacts 436. When pins 434 extend into slot 430, the movement of sliding cover 404 in direction 414 causes pins 434 to wedge, or wipe, against electrical contacts 436. As shown, electrical contacts 436 are in electrical connection with respective soldering pins 418, and thus the pins of components can be connected to a printed circuit board (not shown) to which the soldering pins 418 of ZIF socket 400 have been soldered.

Figure 4D:
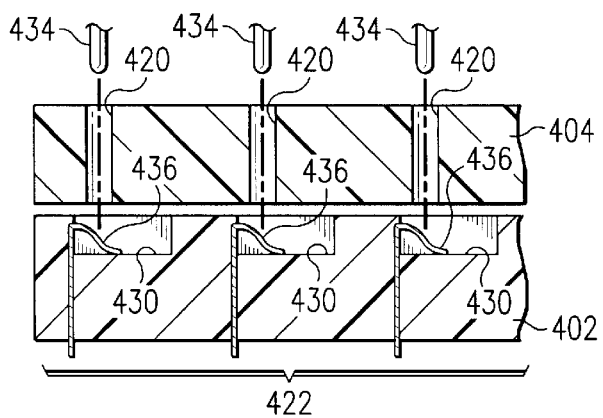
FIG. 4D shows an assembled cut-away plan view of a volume segment of a ZIF style socket.

Referring to FIG. 4D, shown is an assembled cut away plan view of volume segment 426 of FIG. 4C, which illustrates closed position 422 of sliding cover 404. Shown is that in closed position 422 sliding cover 404 is positioned relative to base housing 402 such that apertures 420 are in a position such that any component pins 434 extending through apertures 420 would be in contact with electrical contacts 436.

Referring now to FIG. 4E shown is an assembled cut away plan view of volume segment 426 of FIG. 4C which illustrates open position 424 of sliding cover 404. Shown is that in open position 424 sliding cover 404 is positioned relative to base housing 402 such that apertures 420 are in a position such that any component pins 434 extending thought apertures 420 would not be in contact with electrical contacts 436.

Referring now to FIG. 5, shown is a high-level partial block diagram depicting an embodiment of the present invention. Depicted is component socket 500. Illustrated is actuating device 502, having various modes (e.g., an open mode and a closed mode analogous to those discussed for lever arm 406 of ZIF style socket 400) at least one of which is an anti-contaminant mode, such that if actuating device 502 is in its anti-contaminant mode, foreign matter is substantially forestalled from entering component socket 500. Further shown is that operable connection 504 couples actuating device 502 with component socket 500. Operable connection 504 is such that if actuating device 502 is manipulated into in its anti-containment mode, operable connection 504 will help to effect a change at or near component socket 500 such that the likelihood that foreign matter will enter component socket 500 is substantially reduced.

With reference now to FIG. 6, shown is a high-level partial block diagram depicting an embodiment of the present invention. Depicted is zero insertion force socket 600. Illustrated is actuating device 502, having various modes (e.g., an open mode and a closed mode analogous to those discussed for lever arm 406 of ZIF style connector 400) at least one of which is an anti-contaminant mode, such that if actuating device 502 is in its anti-contaminant mode, foreign matter is substantially forestalled from entering zero insertion force socket 600. Further shown is that operable connection 504 couples actuating device 502 with zero insertion force socket 600. Operable connection 504 is such that if actuating device 502 is manipulated into in its anti-containment mode, operable connection 504 will help to effect a change at or near zero insertion force socket 600 such that the likelihood that foreign matter will enter zero insertion force socket 600 is substantially reduced.

Referring now to FIG. 7, shown is a high-level partial block diagram depicting an embodiment of the present invention. Depicted is zero insertion force socket 600. Illustrated is actuating device 502, having various modes (e.g., an open mode and a closed mode analogous to those discussed for lever arm 406 of ZIF style connector 400) at least one of which is an anti-contaminant mode, such that if actuating device 502 is in its anti-contaminant mode, foreign matter is substantially forestalled from entering zero insertion force socket 600. Shown is that operable connection 504 can include anti-contaminant shield 700. Depicted is that anti-contaminant shield 700 can move, relative to at least one other part (or, alternatively, at least one other part can move relative to anti-contaminant shield 700), into anti-contamination position 702, whereby foreign matter is substantially forestalled from making its way into zero insertion force socket 600. Illustrated is that anti-contaminant shield 700 can also move, relative to at least one other part (or, alternatively, at least one other part can move relative to anti-contaminant shield 700), into device-accessible position 704, which allows components to be inserted into or be resident within zero insertion force socket 600. Operable connection 504 is such that if actuating device 502 is manipulated into in its anti-containment mode, operable connection 504 will help to effect a change in the relative position of anti-contaminant shield 700 such that it moves into anti-contamination position 702. Furthermore, in the event that actuating device 502 is manipulated out of its anti-containment mode, operable connection 504 will help to effect a change in the relative position of anti-containment shield 700 such that it moves into device-accessible position 704.

Referring now to FIG. 8, depicted is a high-level partial block diagram depicting an embodiment of the present invention. Depicted is zero insertion force socket 600. Illustrated is actuating device 502, having various modes (e.g., an open mode and a closed mode analogous to those discussed for lever arm 406 of ZIF style connector 400) at least one of which is an anti-contaminant mode, such that if actuating device 502 is in its anti-contaminant mode, foreign matter is substantially forestalled from entering zero insertion force socket 600. Further shown is linkage 800 coupling actuating device 502 with anti-contaminant shield 700. Linkage 800 is such that if actuating device 502 is manipulated into in its anti-containment mode, a change will be effected in the relative position of anti-contaminant shield 700 such that it moves into anti-contamination position 702. Furthermore, in the event that actuating device 502 is manipulated out of its anti-containment mode, linkage 800 will help to effect a change in the position of anti-containment shield 700 such that it moves into device-accessible position 704.

Those skilled in the art will recognize that several embodiments of the present invention exist where actuating device 502, linkage 800, and anti-contaminant shield 700 themselves have several different embodiments. FIGS. 9A, 9B, 9C, 9D, 9E, 10A, and 10B illustrate some of these different embodiments.

With reference now to FIG. 9A, depicted in FIG. 9A is an embodiment of the present invention in the context of an assembled cut away view of volume segment 426 as was depicted in FIG. 4B. Shown is that slots 430 of base housing 402 have been modified such that each slot 430 now contains anti-contaminant shield 950. Depicted is that sliding cover 404 is in anti-contaminant position 952, which for sake of illustration is shown in the context of open position 424 and closed position 422. For sake of illustration, a space is shown between apertures 420 and their respective anti-contaminant shields 950; however, it is to be understood that in actual operation the distance between sliding member 404 and base housing 402 will be substantially minimized such that when sliding cover 404 is in anti-contaminant position 952, a substantial seal is formed between apertures 420 and their respective anti-contaminant shields 950 so that contaminants are substantially forestalled from entering the portion of slots 430 which have not been modified to contain the anti-contaminant shields 950. One way in which anti-contaminant position 952 can be achieved is by modifying related art ZIF style socket 400 such that lever arm 406 can continue rotating past open mode 408 to a third mode—an anti-contaminant mode—whereby sliding cover 404 is caused to move into anti-contamination position 952.

Referring now to FIG. 9B, shown in FIG. 9B is an embodiment which includes gear assembly 900. First interface 902 articulates with gear rack 906. Rotation of gear assembly 900 about its axis will result in sliding cover 404 moving between anti-contamination position 952 (illustrated by position of dashed line apertures 954) and open position (not shown) and closed position 422 (illustrated by position of apertures 420). Actuating device 910 is illustrated as nubs 912 large enough to allow manipulation by a human user, such that a human user can press upon nubs 912 and cause gear assembly 900 to rotate.

With reference now to FIG. 9C, FIG. 9C shows an embodiment of the present invention which is similar to that shown in FIG. 9B except that in FIG. 9C shown is a rod 904 fused to gear assembly 900 in such a way that gear assembly 900 can be rotated about its axis (not shown). Depicted is that affixed to rod 904 is lever arm having a crank handle 916.

Referring now to FIG. 9D, FIG. 9D depicts an embodiment of the present invention which is similar to that shown in FIG. 9C, except that illustrated in FIG. 9D is lever arm 906 solidly fused with gear assembly 900. Shown is that gear assembly 900 can be rotated via movement of lever arm 906 through arc 909. Such rotation of gear assembly 900 in response to the movement of lever arm 906 will cause sliding cover 404 to move between anti-contamination position 952 (illustrated by position of dashed line apertures 954) and open position (not shown) and closed position 422 (illustrated by position of apertures 420). Those skilled in the art will also recognize that the mechanism of related-art ZIF style socket 400 could also be modified to function substantially as shown in FIG. 9D.

With reference now to FIG. 9E, FIG. 9E depicts an embodiment of the present invention whereby a fixed peg 940 is located affixed to base housing 402, and sliding cover 404 can move along the guide provided by fixed peg 940. Lateral movement of sliding cover 404 along the guide provided by fixed peg 940 will allow movement between anti-contamination position 952 (illustrated by position of dashed line apertures 954) and open position (not shown) and closed position 422 (illustrated by position of apertures 420). In this embodiment, the actuating device is sliding cover 404 itself.

Those skilled in the art will recognize that many other mechanical linkages may be employed to move various and sundry embodiments of anti-contaminant shields between anti-contamination positions and device-accessible positions. Examples of such linkages well known in the art are linkages employing cables (e.g., an assembly having a cable translating the movement of an actuating device into movement of an anti-contaminant shield), and linkages employing springs (e.g., linkages having springs which may be activated by actuating devices, causing an anti-contaminant shield to move from between an anti-contamination position and a device-accessible position).

Those skilled in the art will appreciate that many different types of devices can be used to achieve actuating device 502 beyond those already illustrated. Such devices include but are not limited to lever arms, gears, spring-loaded devices, and other such devices.

Figure 10A:
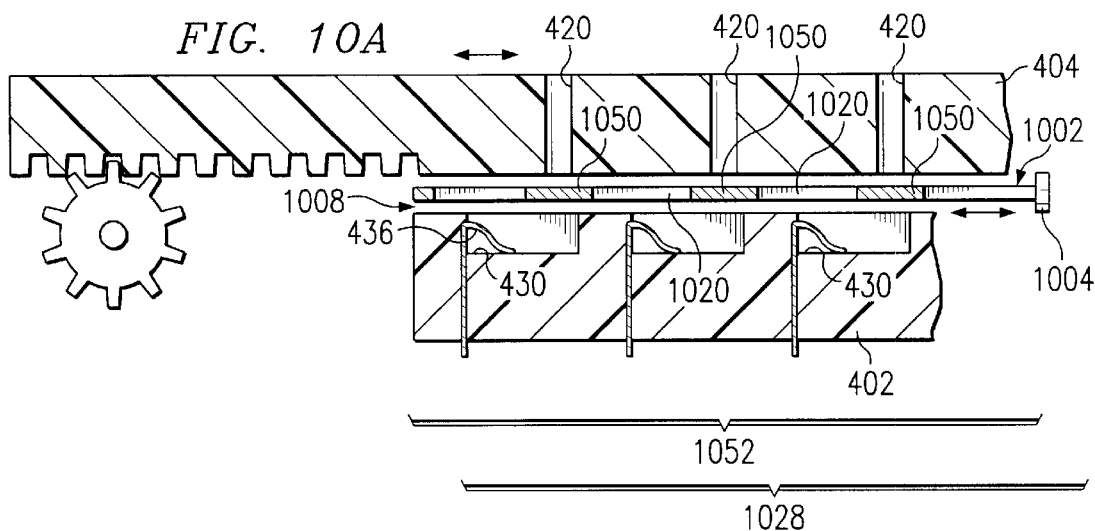
FIG. 10A depicts an embodiment of the present invention which has a blocking device, having anti-contaminant shields and device-accessible orifices.

Referring now to FIG. 10A, shown is an embodiment of the present invention which has a blocking device having anti-containment shields and device-accessible orifices.

FIG. 10A depicts blocking device 1002, having anti-contaminant shields 1050 and device-accessible orifices 1020, which is shown interposed between sliding cover 404 and base housing 402. Knob 1004 is depicted at an end of blocking device 1002. Illustrated is that blocking device 1002 articulates at second interface 1008 with base housing 402. Depicted is that knob 1004 has least two modes: anti-contamination mode and device-accessible mode. When knob 1004 is in anti-contaminant mode, blocking device 1002 is in anti-contaminant position 1052, and thereby blocks contaminants from entering base housing 402 via apertures 420. When knob 1004 is in device-accessible mode, blocking device 1002 is in device-accessible position 1028, and thus sliding cover 404 can be utilized to move to device open and device closed positions (that is, device-accessible orifices 1020 are positioned such that slots 430 are accessible). Although the various constituent parts have been shown as separated, those skilled in the art will appreciate that the parts are to be close enough together such that a seal between apertures 420 and anti-contaminant shields 1050 are effected.

Figure 10B:
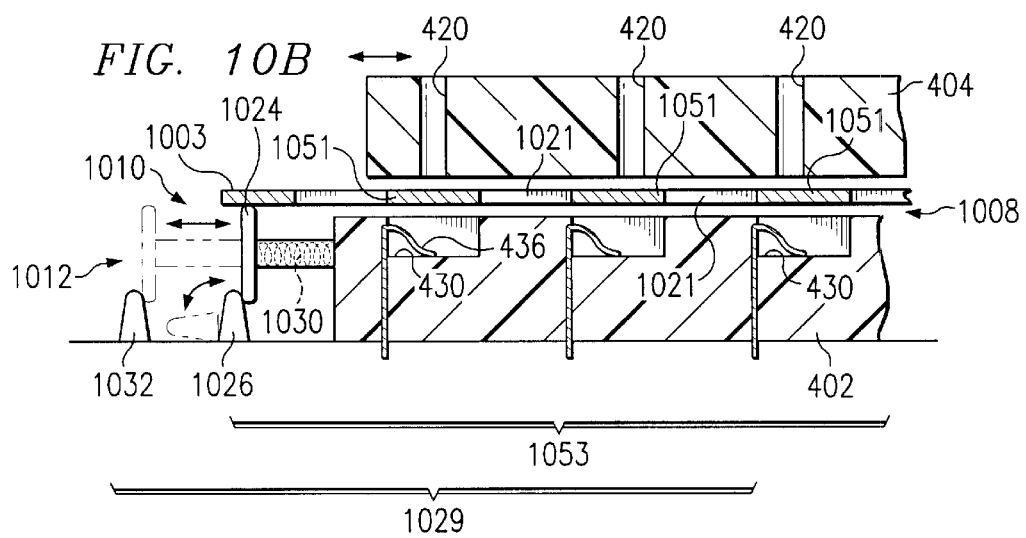
FIG. 10B illustrates another embodiment of the present invention which has a blocking device having anti-contaminant shields and device accessible orifices, wherein the sealing can be effected irrespective of whether a sliding cover is in an open position or a closed position.

In the embodiment shown in FIG. 10A, sliding cover 404 is illustrated as being in open position 424 (as was illustrated by position of apertures 420 in FIG. 10A) in order for a seal between apertures 420 and anti-contaminant shields 1050 are effected. FIG. 10B illustrates another embodiment of the present invention wherein the sealing can be effected irrespective of whether sliding cover 404 is in open position 424 or closed position 422. Depicted is blocking device 1003, having anti-contaminant shields 1051 and device-accessible orifices 1021, which is shown interposed between sliding cover 404 and base housing 402. Spring-loaded member 1024 is depicted at an end of blocking device 1003. Illustrated is that blocking device 1003 articulates at second interface 1008 with base housing 402. Depicted is that spring-loaded member 1024 has least two modes: anti-contamination mode and device-accessible mode. When spring-load member 1024 is in anti-contaminant mode, blocking device 1003 is in anti-contaminant position 1053, and anti-contaminant shield 1051 block contaminants from entering base housing 402 via apertures 420. However, when rotatable nub 1026 (a mechanical switch) is rotated downward, spring-loaded member 1024 moves (under power of spring 1030) until detained by non-rotatable nub 1032, such that blocking device 1003 is in device accessible position 1029. That is, device-accessible orifices are oriented such that access to slots 430 are now possible. When spring-loaded member 1024 is in device-accessible position 1028, sliding cover can be utilized to move to device open and device closed positions (that is, device-accessible orifices 1021 are positioned such that slots 430 are accessible). Since in the embodiment shown, anti-contaminant shields 1051 and device-accessible orifices 1021 are shown to be co-equal in size and having the same size openings as slots 430, the embodiment shown provides sealing against contaminants irrespective of the positioning of cover sliding 404.

Those skilled in the art will recognize that many different types of linkages can be utilized beyond those shown, such as electromechanical linkages. Such electromechanical linkages can be effectively controlled by a number of switches, including but not limited to mechanical throw switches, mechanical push-button switches, electronic switches, and various and sundry combinations of the foregoing.

The foregoing described embodiments depict different components contained within, or connected with, different other components. It is to be understood that such depicted architectures are merely exemplary, and that in fact many other architectures can be implemented which achieve the same functionality. In an abstract, but still definite, sense those within the art will appreciate that any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such limitation is present. For non-limiting example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when same claim includes the introductory phrases "one or more" or "at least one" and indefinite articles such as "a" or "an"; the same holds true for the use of definite articles used to introduce claim elements.

What is claimed is:

1. An apparatus, comprising:
    a component socket including a plurality of slots configured to receive an electrical component, wherein said component socket is a zero insertion force socket;
    an anti-contaminant shield operably coupled to said component socket; and
    an actuating device, operably coupled with said component socket and the anti-contaminant shield, wherein said actuating device is configured to close said plurality of slots with the anti-contaminant shield whereby foreign matter is substantially forestalled from entering said component socket.

2. The apparatus of claim 1, wherein:
    the anti-contaminant shield is incorporated within a zero insertion force socket base housing.

3. The apparatus of claim 2, further comprising:
    a zero insertion force socket sliding cover.

4. The apparatus of claim 1, further comprising:
    a blocking device, wherein the blocking device includes the anti-contaminant shield.

5. The apparatus of claim 4, wherein:
    the anti-contaminant shield is substantially adjacent to a zero insertion force socket base housing.

6. The apparatus of claim 4, wherein:
    the anti-contaminant shield is substantially adjacent to a zero insertion force socket sliding cover.

7. The apparatus of claim 1, wherein said actuating device further comprises:
  a linkage between said actuating device and the anti-contaminant shield.

8. The apparatus of claim 7, wherein said linkage between said actuating device and the anti-contaminant shield further comprises:
  a mechanical linkage between said actuating device and the anti-contaminant shield.

9. The apparatus of claim 8, wherein said mechanical linkage between said actuating device and the anti-contaminant shield further comprises:
  a gear.

10. The apparatus of claim 8, wherein said mechanical linkage between said actuating device and the anti-contaminant shield further comprises:
  a rigid member.

11. The apparatus of claim 8, wherein said mechanical linkage between said actuating device and the anti-contaminant shield further comprises:
  a spring.

12. The apparatus of claim 1, wherein said actuating device further comprises:
  a lever arm.

13. The apparatus of claim 1, wherein said actuating device further comprises:
  a gear apparatus.

14. The apparatus of claim 1, wherein said actuating device further comprises:
  a knob.

15. The apparatus of claim 1, wherein said actuating device further comprises:
  a mechanical switch.

16. A computer system, comprising:
  a component socket including a plurality of slots configured to receive an electrical component, wherein said component socket further comprises a zero insertion force socket;
  an anti-contaminant shield operably coupled to said component socket;
  an actuating device, operably coupled with said component socket and the anti-contaminant shield, wherein said actuating device is configured to close the plurality of slots with the anti-contaminant shield whereby foreign matter is substantially forestalled from entering said component socket;
  an operating system;
  a processing unit;
  a first bridge;
  a system memory; and
  an input-output bus.

17. The computer system of claim 16, further comprising:
  a graphics bus;
  a graphics controller;
  a local frame buffer;
  a display device;
  an input-output bridge; and
  a network card.

18. The computer system of claim 16, further comprising:
  a hard drive;
  a digital camera;
  a microphone; and
  videoconferencing software.

19. The computer system of claim 16, wherein:
  the anti-contaminant shield is incorporated within a zero insertion force socket base housing.

20. The computer system of claim 19, further comprising:
  a zero insertion force socket sliding cover.

21. The computer system of claim 16, further comprising:
  a blocking device, wherein the blocking device includes the anti-contaminant shield.

22. The computer system of claim 14, wherein:
  the anti-contaminant shield is substantially adjacent to a zero insertion force socket base housing.

23. The computer system of claim 14, wherein:
  the anti-contaminant shield is substantially adjacent to a zero insertion force socket sliding cover.

24. The computer system of claim 16, wherein said actuating device further comprises:
  a linkage between said actuating device and the anti-contaminant shield.

25. The computer system of claim 24, wherein said linkage between said actuating device and the anti-contaminant shield further comprises:
  a mechanical linkage between said actuating device and the anti-contaminant shield.

26. The computer system of claim 25, wherein said mechanical linkage between said actuating device and the anti-contaminant shield further comprises:
  a gear.

27. The computer system of claim 25, wherein said mechanical linkage between said actuating device and the anti-contaminant shield further comprises:
  a rigid member.

28. The computer system of claim 25, wherein said mechanical linkage between said actuating device and the anti-contaminant shield further comprises:
  a spring.

29. The computer system of claim 24, wherein said linkage between said actuating device and the anti-contaminant shield further comprises:
  an electro-mechanical linkage between said actuating device and the anti-contaminant shield.

30. The computer system of claim 16, wherein said actuating device further comprises:
  a lever arm.

31. The computer system of claim 16, wherein said actuating device further comprises:
  a gear apparatus.

32. The computer system of claim 16, wherein said actuating device further comprises:
  a knob.

33. The computer system of claim 16, wherein said actuating device further comprises:
  a mechanical switch.

34. A method, comprising:
  operably coupling an actuating device with a zero insertion force component socket and an anti-contaminant shield;
  setting said actuating device to at least one anti-contaminant mode; and
  blocking a plurality of slots of the component socket with the anti-contaminant shield whereby foreign matter is substantially forestalled from entering the component socket and wherein the component socket is configured to receive an electrical component.

35. The method of claim 34, wherein said operably coupling said actuating device with the anti-contaminant shield further comprises:

operably coupling the actuating device with a zero insertion force base housing having an anti-contaminant shield.

36. The method of claim 34, wherein said operably coupling said actuating device with the anti-contaminant shield further comprises:

operably coupling the actuating device to a blocking device having an anti-contaminant shield.

37. The method of claim 34, wherein said operably coupling said actuating device with the anti-contaminant shield further comprises:

interposing a linkage between said actuating device and the anti-contaminant shield.

38. The method of claim 37, wherein said interposing the linkage between said actuating device and the anti-contaminant shield further comprises:

interposing a mechanical linkage between said actuating device and the anti-contaminant shield.

39. The method of claim 37, wherein said interposing the linkage between said actuating device and the anti-contaminant shield further comprises:

interposing at least one gear between said actuating device and the anti-contaminant shield.

40. The method of claim 37, wherein said interposing the linkage between said actuating device and the anti-contaminant shield further comprises:

interposing at least one rigid member between said actuating device and the anti-contaminant shield.

41. The method of claim 37, wherein said interposing the linkage between said actuating device and the anti-contaminant shield further comprises:

interposing at least one spring between said actuating device and the anti-contaminant shield.

42. The method of claim 34, wherein said operably coupling said actuating device with the component socket further comprises:

operably coupling the component socket with a lever arm, said lever arm having at least one anti-contaminant mode.

43. The method of claim 34, wherein said operably coupling said actuating device with the component socket further comprises:

operably coupling the component socket with a mechanical switch, said mechanical switch having at least one anti-contaminant mode.

44. A method, comprising:

manipulating an actuating device into an anti-contaminant mode wherein said manipulating said actuating device further comprises rotating a gear; and in response to said manipulating, positioning an anti-contaminant shield into an anti-contaminant position whereby foreign matter is substantially forestalled from entering a component socket, wherein the component socket is operably coupled to said actuating device and configured to receive an electrical component.

45. The method of claim 44, said manipulating said actuating device into the anti-contaminant mode further comprising:

moving a mechanical lever arm.

46. The method of claim 44, said manipulating said actuating device into the anti-contaminant mode further comprising:

actuating a switch.

\* \* \* \* \*